United States Patent [19]

Brehm et al.

[11] Patent Number: 4,549,197
[45] Date of Patent: Oct. 22, 1985

[54] COMMON-GATE GAAS FET DESIGN FOR MONOLITHIC MICROWAVE INTEGRATED CIRCUITS

[75] Inventors: Gailon E. Brehm, Plano; Randall E. Lehmann, Garland, both of Tex.

[73] Assignee: Texas Instruments Incorporated, Dallas, Tex.

[21] Appl. No.: 395,416

[22] Filed: Jul. 6, 1982

[51] Int. Cl.[4] .................... H01L 27/02; H01L 29/80
[52] U.S. Cl. ..................... 357/41; 357/22; 357/68; 357/15
[58] Field of Search .................... 357/68, 22, 15, 41

[56] References Cited

U.S. PATENT DOCUMENTS 4,380,022  4/1983  Yoder ................... 357/22

OTHER PUBLICATIONS

*MTT Symposium Proceedings*, 1981, W. C. Petersen et al., "A Monolithic GaAs 0.1 to 10.0 GHz Amplifier", pp. 354–355.
*IEEE Intn'l Solid-State Ckts. Conf.*, vol. 25, Feb. 11, 1982, D. B. Estreich, "A Wideband Monolithic GaAs IC Amplifier", pp. 194–195.
*IEEE Intn'l Solid-State Ckts. Conf.*, vol. 25, Feb. 11, 1982, R. E. Lehmann et al., "10 GHz 3-Stage Monolithic 4DB Noise Fig. Amp", pp. 140–141.
*MTT Symposium Proceedings*, 1981, R. S. Pengelly et al., "A Comparison Between Actively and Passively Matched S-Band GaAs Mono. FET Amp", pp. 367–368.

*Primary Examiner*—Andrew J. James
*Assistant Examiner*—Terri M. Henn
*Attorney, Agent, or Firm*—Robert Groover, III; James T. Comfort; Melvin Sharp

[57] ABSTRACT

In order to provide low and exactly repeatable common lead inductance (gate lead inductance) and low feedback parasitics in a common-gate low noise amplifier, a GaAs FET connects the gate electrode to ground at various points along its width by means of an air bridge crossover structure. This structure crosses over the input (source) lines with very low capacitance. Since the gate lead inductance is low in this design, and because in monolithic form this inductance does not vary as is the case for a device grounded using bond wires, common-gate circuit stability is assured. This device preferably uses the well-known pi-gate configuration to provide low drain-gate parasitic capacitance and equal phasing to all parts of the device.

15 Claims, 1 Drawing Figure

COMMON-GATE GAAS FET DESIGN FOR MONOLITHIC MICROWAVE INTEGRATED CIRCUITS

BACKGROUND OF THE INVENTION

The present invention relates to active monolithic microwave devices.

Previous monolithic microwave integrated circuits (MMICs) have used GaAs FETs in a common-source configuration. In this case, the source regions (usually three or more regions) are connected to ground potential areas of the circuit in a low-inductance manner, the input signal is applied to the gate, and the output signal is taken from the drain. In the prior art of such monolithic FET configurations, the source regions are connected to the expanded ground areas at the top and bottom of the photograph using plated gold air bridges when it is necessary to cross over the gate feeds. The input gate transmission line is split into two or more feeds as is the output drain transmission line. The submicrometer gate itself is a single line located vertically between the source and drain regions. This "pi-gate" device design provides low output-to-input feedback capacitance and uniform phasing along the device.

A monolithic common-gate amplifier was published in 1981, in the preceedings of the MTT Symposium. See Peterson et al, "A Monolithic GaAs 0.1 to 10 GHz Amplifier", *MTT Symposium Proceedings* at page 354. However, this device did not teach the innovative air bridge configuration which is used to achieve the advantages of the present invention.

A key requisite in realizing a common-gate amplifier monolithically is a low and repeatable gate inductance. If the gate inductance is not low, it may lead to instability. If the gate inductance is not repeatable, the resulting device inconsistency will not permit economical integrated circuit fabrication techniques.

Thus it is an object of the present invention to provide a monolithic common-gate device structure which can be monolithically realized with low and repeatable gate to ground inductance.

SUMMARY OF THE INVENTION

In order to provide low and exactly repeatable common lead inductance (gate lead inductance) and low feedback parasitics in a common-gate low noise amplifier, a GaAs FET connects the gate electrode to ground at various points along its width by mens of an air bridge crossover structure. This structure crosses over the input (source) lines with very long capacitance. Since the gate lead inductance is low in this design, and because in monolithic form this inductance does not vary as is the case for a device grounded using bond wires, common-gate circuit stability is assured. This device preferably uses the well-known pi-gate configuration to provide low drain-gate parasitic capacitance and equal phasing to all parts of the device.

These three features of the present invention—air bridge interconnection of the gate feed points to ground, multiple feedpoints to the source input and drain output, and the "pi-gate" device design—provide the low and repeatable gate inductance, low gate-drain feedback, and equal phasing essential for a stable, high-performance common-gate amplifier.

According to the present invention there is provided: a monolithic common-gate active device, comprising: a gate, said gate comprising a stripe of metal having a lesser dimension of less than one and one half microns and a greater dimension which is more than 100 microns; a plurality of source regions, said source regions being positioned parallel, adjacent to, and separated from said gate, all of said plurality of source regions being commonly fed; a drain region, said drain region being parallel, adjacent to, and separated from said gate, said source and drain regions lying on opposite sides of said gate; said plurality of source regions being fed by respective source feeds, all of said source feeds being connected together in common; a gate pad, said gate pad being connected to said gate and being positioned within the area defined by said plurality of source feeds; a ground contact; and an air bridge connecting said gate pad over at least one of said source feeds to said ground contact.

BRIEF DESCRIPTION OF THE DRAWING

The present invention will be described with reference to the accompanying drawing, wherein.

DESCRIPTION OF THE PREFERRED EMBODIMENTS

Figure 1:
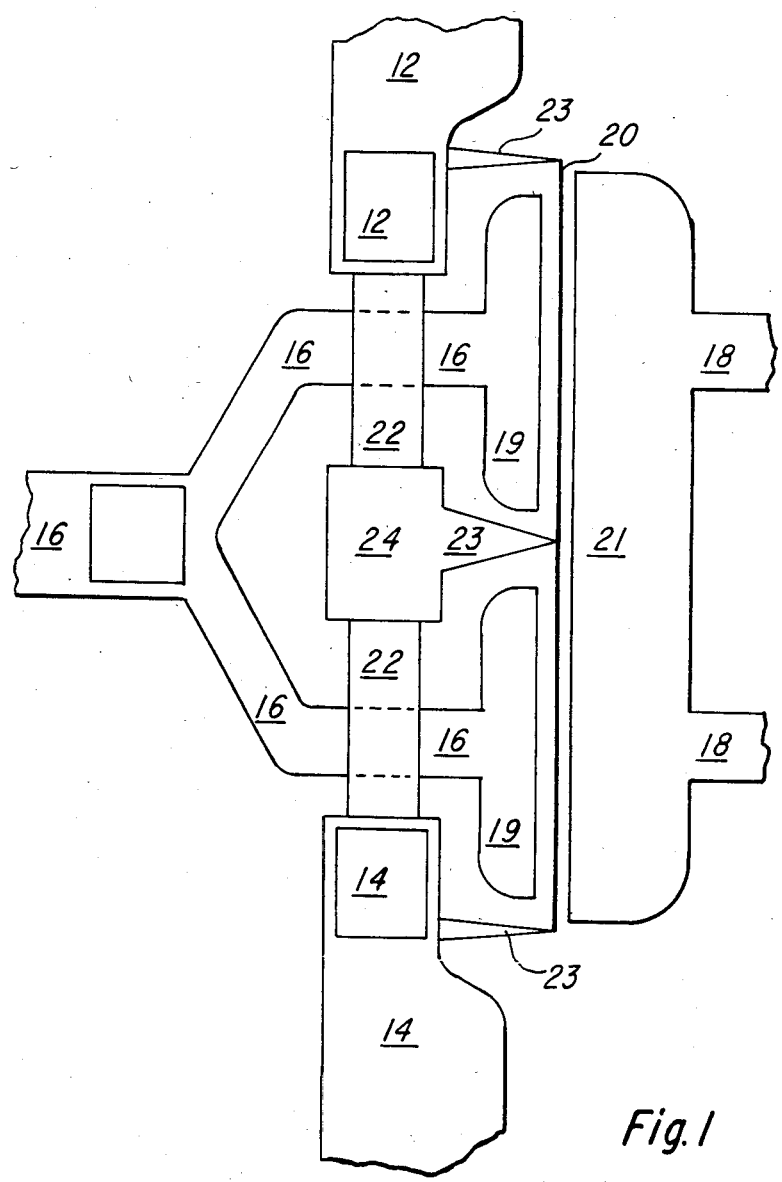
FIG. 1 shows an example of a monolithic grounded-gate device configuration according to the present invention.

The present invention combines the advantages of the basic "pi-gate" GaAs FET device design with the circuit performance advantages achieved by the common-gate configuration. In the common-gate configuration, the FET gate is connected to ground in a low-inductance fashion, the input signal is applied to the source, and the output is taken from the drain. This configuration, discussed in simultaneously filed application No. 395,399, filed 7-6-82 (TI-9422) which is hereby incorporated by reference, offers very good input match along with good noise figure. Problems with poor stability and poor control of parasitics have previously limited the implementation of grounded-gate amplifier configurations.

The present invention is a monolithically integrated common-gate microwave pi-gate GaAs FET which has demonstrated the performance advantages of common-gate circuits without stability problem. This novel device design, shown in FIG. 1, provides an air-bridge interconnection of the gate feed points to ground. As a result, the gate-to-ground inductance is minimal and is exactly repeatable from device to device. The pi-gate configuration with the single gate stripe located in a vertical line between the source and drain provides minimum feedback capacitance. Multiple gate and drain feeds are used to provide equal phasing over the whole device.

FIG. 1 shows an example of a device configuration according to the present invention. A gate 20 lies between a source 19 and a drain 21. In the presently preferred embodiment, the gate 20 is one half micron long and 300 microns wide, but these dimensions may be varied as desired. Source and drain feeds 16 and 18 are provided to connect to the source and to the drain respectively, at separated points along their length. This provides the advantage of equal phasing across the device, and avoids ohmic losses. Contact to the gate is then made through fingers 23, which contact the gate stripe 20 at intervals along its length. While the end point contacts can be connected directly to ground planes 12 and 14, this is not possible in a planar configuration where more than two contacts to the gate are made. However, it is highly desirable to have more than two contacts to the gate, to avoid inductive reactance and ohmic loss in the gate circuit. Thus, in the present invention, one or more additional fingers 23 lead from the gate to one or more additional gate pads 24, and these additional gate pads 24 are connected to the ground planes 12 or 14 by means of air bridges 22. A key advantage of these air bridges is that they provide an extremely low capacitive coupling between the gate and source circuit.

This is particularly important where very long gates are used. Since, as noted in co-filed application No. 395,399 (TI-9422), it is desirable to use extremely long gate widths for low-noise applications, the present invention provides a configuration by means of which very large gate widths (up to thousands of microns) can easily be realized.

The process steps which are used to fabricate the device of the present invention are conventional to gallium arsenide processing. For example, in a chromium-doped semi-insulating gallium arsenide substrate, a mesa etch is first used to define the active regions. The ohmic contact metal is then patterned and deposited. (Preferably this metal is gold/germanium/nickel.) The gate metal is then defined and deposited. (Preferably this comprises sequential layers of titanium, platinum, and gold.) The source/drain overlay metal is then defined and deposited (preferably this comprises sequential layers of titanium and gold.) Finally, the gold air bridges are defined and plated. Processing then continues with other conventional steps to complete the desired integrated circuit.

Thus it is an advantage of the present invention that a common-gate active device is provided which has very low and exactly repeatable gate lead inductance.

It is a further advantage of the present invention that an active common-gate device having extremely large gate widths is provided which has small ohmic losses in the gate.

It is a further advantage of the present invention that a common-gate active device having large gate widths is provided which has low and exactly repeatable gate lead inductance.

It is a further advantage of the present invention that a common-gate active device is provided which has low parasitic capacitances.

What is claimed is:

1. A monolithic common-gate active device, comprising:
   a gate, said gate comprising a stripe of metal having a lesser dimension of less than one and one half microns and a greater dimension which is more than 100 microns;
   a plurality of source regions, said source regions being positioned parallel, adjacent to, and separated from said gate, all of said plurality of source regions being commonly fed;
   a drain region, said drain region being parallel, adjacent to, and separated from said gate, said source and drain regions lying on opposite sides of said gate;
   said plurality of source regions being fed by respective source feed, all of said source feeds being connected together in common;
   a gate pad, said gate pad being connected to said gate and being positioned within the area defined by said plurality of source feeds;
   a ground contact; and
   an air bridge connecting said gate pad over at least one of said source feeds to said ground contact.

2. A monolithic common-gate active device, comprising:
   a gate, said gate comprising a stripe of metal having a lesser dimension of less than one and one half microns and a greater dimension which is more than 100 microns;
   a plurality of drain regions, said drain regions being positioned parallel, adjacent to, and separated from said gate, all of said plurality of drain regions being commonly fed;
   a source region, said source region being parallel, adjacent to, and separated from said gate, said drain and source regions lying on opposite sides of said gate;
   said plurality of drain regions being fed by respective drain feeds, all of said drain feeds being connected together in common;
   a gate pad, said gate pad being connected to said gate and being positioned within the area defined by said plurality of drain feeds;
   a ground contact; and
   an air bridge connecting said gate pad over at least one of said drain feeds to said ground contact.

3. The device of claim 1 or 2, further comprising additional contacts to said gate near the ends of said gate, said additional contacts also being connected to said ground contact.

4. The device of claim 1, wherein said drain is connected by multiple separate leads to a drain feed, said multiple separate leads being spaced along the length of said drain.

5. The device of claim 2, wherein said source is connected by multiple separate leads to a source feed, said multiple separate leads being spaced along the length of said source.

6. The device of claim 1, 2, 4, or 5, wherein said gate lies on a semiconducting substrate.

7. The device of claim 6, wherein said semiconducting substrate is gallium arsenide.

8. A monolithic common-gate active device, comprising:
   a gate, said gate comprising a stripe of metal having a lesser dimension of less than one and one-half microns and a greater dimension which is more than 100 microns;
   a plurality of source regions, said source regions being positioned parallel, adjacent to, and separated from one side of said gate stripe, all of said plurality of source regions being commonly fed;
   a drain region, said drain region being parallel, adjacent to, and separated from said gate, said source and drain regions lying on opposite sides of said gate;
   said plurality of source regions being fed by respective source feeds, all of said source feeds being connected together in common;
   a gate pad, said gate pad being connected to said gate stripe and being positioned within the area defined by said plurality of source feeds adjacent to one side of said gate stripe;
   a ground contact; and
   an air bridge connecting said gate pad over at least one of said source feeds to said ground contact.

9. A monolithic common-gate active device, comprising:

a gate, said gate comprising a stripe of metal having a lesser dimension of less than one and one-half microns and a greater dimension which is more than 100 microns;

a plurality of drain regions, said drain regions being positioned parallel, adjacent to, and separated from one side of said gate stripe, all of said plurality of drain region being commonly fed;

a source region, said source region being parallel, adjacent to, and separated from said gate, said drain and source regions lying on opposite sides of said gate;

said plurality of drain regions being fed by respective drain feeds, all of said drain feeds being connected together in common;

a gate pad, said gate pad being connected to said gate stripe and being positioned within the area defined by said plurality of drain feeds adjacent to one side of said gate stripe;

a ground contact; and an air bridge connecting said gate pad over at least one of said drain feeds to said ground contact.

10. The device of claim 8, further comprising additional contacts to said gate near the ends of said gate, said additional contacts also being connected to said ground contact.

11. The device of claim 9, further comprising additional contacts to said gate near the ends of said gate, said additional contacts also being connected to said ground contact.

12. The device of claim 8, wherein said drain is connected by multiple separate leads to a drain feed, said multiple separate leads being spaced along the length of said drain.

13. The device of claim 9, wherein said source is connected by multiple separate leads to a source feed, said multiple separate leads being spaced along the length of said source.

14. The device of claim 8 or claim 9, wherein said gate lies on a semiconducting substrate.

15. The device of claim 14, wherein said semiconducting substrate is gallium arsenide.

* * * * *